United States Patent
Chen et al.

(10) Patent No.: US 9,638,549 B2
(45) Date of Patent: May 2, 2017

(54) INTEGRATED CAPACITANCE SENSING MODULE AND ASSOCIATED SYSTEM

(71) Applicant: eMemory Technology Inc., Hsin-Chu (TW)

(72) Inventors: Wei-Ren Chen, Pingtung County (TW); Wen-Hao Lee, Hsinchu County (TW); Hsin-Chou Liu, Kaohsiung (TW); Ching-Sung Yang, Hsinchu (TW)

(73) Assignee: EMEMORY TECHNOLOGY INC., Hsin-Chu (TW)

( * ) Notice: Subject to any disclaimer, the term of this patent is extended or adjusted under 35 U.S.C. 154(b) by 34 days.

(21) Appl. No.: 14/729,250

(22) Filed: Jun. 3, 2015

(65) Prior Publication Data
US 2016/0123775 A1 May 5, 2016

Related U.S. Application Data

(60) Provisional application No. 62/073,038, filed on Oct. 31, 2014.

(51) Int. Cl.
*H03F 3/08* (2006.01)
*H01L 31/02* (2006.01)
(Continued)

(52) U.S. Cl.
CPC .......... *G01D 5/24* (2013.01); *G06K 9/0002* (2013.01); *G11C 29/1201* (2013.01);
(Continued)

(58) Field of Classification Search
CPC  G01R 33/098; G01R 33/096; G01R 19/0084; G01R 33/0011; G01R 33/0052;
(Continued)

(56) References Cited

U.S. PATENT DOCUMENTS 4,625,176 A * 11/1986 Champion ............. G01R 29/12
324/457
4,766,368 A * 8/1988 Cox ..................... H03K 17/955
324/662
(Continued)

OTHER PUBLICATIONS

Satoshi (A Single-Chip Fingerprint Sensor and Identifier, p. 1852-1859, IEEE Journal of Solid-State Circuits, vol. 34, No. 12, Dec. 1999).*

(Continued)

*Primary Examiner* — Patrick Assouad
*Assistant Examiner* — Taqi Nasir
(74) *Attorney, Agent, or Firm* — WPAT, PC; Justin King (57) ABSTRACT

An integrated capacitance sensing module includes a silicon substrate, a first and a second and a third interlayer dielectric layers, plural conducting layers, a shielding layer, a lower and a upper sensing electrode layers, a protective coating layer. An embedded memory and a sensing circuit are constructed in the silicon substrate. The first interlayer dielectric layer covers the silicon substrate. The plural conducting layers are formed over the first interlayer dielectric layer. The shielding layer is formed over the plural conducting layers. The second interlayer dielectric layer covers the shielding layer. The lower sensing electrode layer is formed over the second interlayer dielectric layer. The third interlayer dielectric layer is formed over the lower sensing electrode layer. The upper sensing electrode layer is formed over the third interlayer dielectric layer. The protective coating layer covers the upper sensing electrode layer.

18 Claims, 7 Drawing Sheets

(51) Int. Cl.
*G01D 5/24* (2006.01)
*H01L 27/115* (2017.01)
*H01L 27/02* (2006.01)
*H01L 23/552* (2006.01)
*H01L 27/112* (2006.01)
*G11C 29/00* (2006.01)
*G11C 29/12* (2006.01)
*G06K 9/00* (2006.01)

(52) U.S. Cl.
CPC ............ *G11C 29/78* (2013.01); *H01L 23/552* (2013.01); *H01L 27/0248* (2013.01); *H01L 27/115* (2013.01); *H01L 27/11206* (2013.01); *H01L 2924/0002* (2013.01)

(58) Field of Classification Search
CPC .. G01R 15/205; G01R 33/091; G01R 15/202; G01R 27/26; G01R 27/2605; G01D 5/24; G01D 5/241; G01D 5/2412; G01D 5/2417; G06K 9/0002; H03K 17/955; H03K 2217/960725; G06F 3/0414; G06F 2203/04103; G01L 1/146
USPC ............. 324/519, 633, 609, 686, 178, 76.11, 324/76.75, 252, 762.01, 762.05, 71, 9, 324/71.5, 548, 658, 661, 662, 669, 671, 324/684, 76.1, 1, 76.79, 76.81, 719, 324/123 R, 23 C, 750.17; 702/47, 52; 345/174, 173
See application file for complete search history.

(56) References Cited

U.S. PATENT DOCUMENTS

| | | | |
|---|---|---|---|
| 6,166,403 A * | 12/2000 | Castagnetti | H01L 23/552 257/208 |
| 6,191,593 B1 * | 2/2001 | Tartagni | G01B 7/004 324/663 |
| 7,257,714 B1 | 8/2007 | Shen | |
| 7,328,377 B1 * | 2/2008 | Lewis | G06F 11/106 714/48 |
| 8,941,167 B2 * | 1/2015 | Chen | H01L 29/42328 257/315 |
| 9,323,975 B2 * | 4/2016 | Riedijk | G06K 9/00013 |
| 2007/0034423 A1 * | 2/2007 | Rebeschi | G06F 3/044 178/18.06 |
| 2008/0005583 A1 | 1/2008 | Shen | |
| 2010/0084542 A1 * | 4/2010 | Chou | H03F 3/08 250/214 A |
| 2011/0141052 A1 * | 6/2011 | Bernstein | G06F 3/016 345/174 |
| 2011/0246790 A1 | 10/2011 | Koh et al. | |
| 2013/0193988 A1 | 8/2013 | Benkley, III | |

OTHER PUBLICATIONS

Satoshi Shigematsu et al., "A Single-Chip Fingerprint Sensor and Identifier" IEEE Journal of Solid-State Circuits, 19991201, vol. 34, Nr:12, pp. 1852-1859, IEEE Service Center, Piscataway, NJ, USA—ISSN 0018-9200. EPO Non-Patent Literature reference No. XP001149326.

Hai Li et al., "Introduction to Semiconductor Memories" Nonvolatile Memory Design: Magnetic, Resistive, and Phase Changing, 20110101, pp. 1-30, CRC Press. EPO Non-Patent Literature reference No. XP055261080.

S. J. Kim et al., "A CMOS Fingerprint System-on-a-Chip With Adaptable Pixel Networks and Column-Parallel Processors for Image Enhancement and Recognition," in IEEE Journal of Solid-State Circuits, vol. 43, No. 11, pp. 2558-2567, Nov. 2008. doi: 10.1109/JSSC.2008.2005809.

European Patent Office, Search Report issued Apr. 13, 2016.

* cited by examiner

INTEGRATED CAPACITANCE SENSING MODULE AND ASSOCIATED SYSTEM

This application claims the benefit of U.S. provisional patent application No. 62/073,038, filed Oct. 31, 2014, the disclosure of which is incorporated by reference herein in its entirety.

FIELD OF THE INVENTION

The present invention relates to a capacitance sensor, and more particularly to an integrated capacitance sensing module and an associated system.

BACKGROUND OF THE INVENTION

In recent years, high-tech electronic devices such as notebook computers, tablet computers or smart phones are integrated into a fingerprint recognition system to protect data security of the electronic devices. Moreover, the applications of the fingerprint recognition system are gradually expanded. The example of the fingerprint recognition system includes a vehicular fingerprint recognition system or a vehicle or a door lock fingerprint recognition system. Consequently, the application range of the fingerprint recognition system is broadened.

Figure 1:
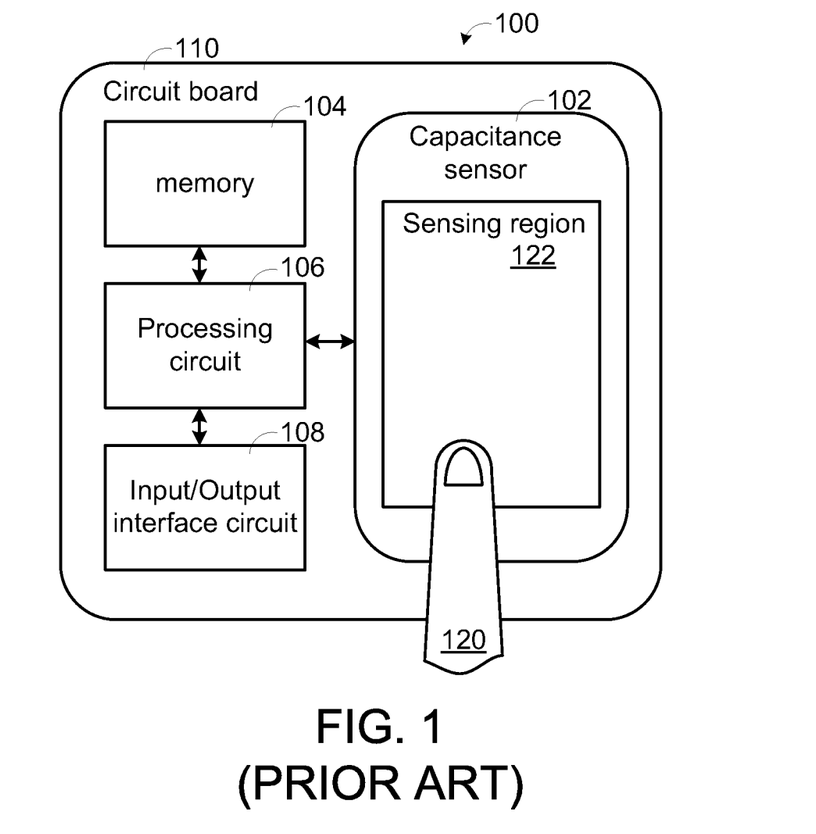
FIG. 1 (prior art) is a schematic functional block diagram illustrating a fingerprint recognition system.

FIG. 1 is a schematic functional block diagram illustrating a fingerprint recognition system. As shown in FIG. 1, the fingerprint recognition system 100 comprises a circuit board 110, a capacitance sensor 102, a memory 104, a processing circuit 106 and an input/output interface circuit 108. The capacitance sensor 102, the memory 104, the processing circuit 106 and the input/output interface circuit 108 are mounted on the circuit board 110.

Generally, plural capacitors (not shown) are located at a sensing region 122 of the capacitance sensor 102 according to the layout configuration. In a data creating mode, the user's finger 120 is placed on the sensing region 122 of the capacitance sensor 102. According to a change of the electric field of the sensing region 122, a sensing circuit (not shown) of the capacitance sensor 102 realizes the changes of the capacitance values of the plural capacitors. According to the changes of the capacitance values of the plural capacitors, the sensing circuit of the capacitance sensor 102 acquires the biometric data of the user's finger 120 (also referred as a scan data). Then, the scan data is defined as a user scan data by the processing circuit 106, and the user scan data is stored into the memory 104. An example of the memory 104 is a nonvolatile memory that can preserve the user scan data.

In a data identification mode, when the user's finger 120 is placed on the sensing region 122 of the capacitance sensor 102, the sensing circuit acquires a first scan data of the user's finger 120. Moreover, the processing circuit 106 compares the first scan data with the user scan data in the memory 104. If the processing circuit 106 confirms that the first scan data complies with the user scan data, the processing circuit 106 controls the input/output interface circuit 108 to issue an acknowledge signal. Whereas, if the processing circuit 106 confirms that the first scan data does not comply with the user scan data, the processing circuit 106 controls the input/output interface circuit 108 to issue a not-acknowledge signal.

For example, the fingerprint recognition system 100 is a door lock fingerprint recognition system. After the acknowledge signal is received by an electronic door lock, the electronic door lock is switched to an unlocked state and thus the door is opened. Whereas, if the not-acknowledge signal is received by the electronic door lock, the electronic door lock is maintained in the unlocked state and the door is not opened.

Since the fabricating processes of the electronic components of the fingerprint recognition system 100 are different, the manufacturer of the fingerprint recognition system 100 has to purchase the capacitance sensor 102, the memory 104, the processing circuit 106 and the input/output interface circuit 108 from different vendors. After the layout trace of the circuit board 110 is designed and the electronic components are mounted on the circuit board 110, these electronic components are electrically connected with each other through the layout trace.

SUMMARY OF THE INVENTION

An object of the present invention provides an integrated capacitance sensing module and an associated system. By a logic circuit process (e.g., a CMOS process), a capacitor sensor and a memory are constructed in the same substrate, fabricated at the same time and thus formed as the integrated capacitance sensing module.

A first embodiment of the present invention provides an integrated capacitance sensing module. The integrated capacitance sensing module includes a silicon substrate, a first interlayer dielectric layer, plural conducting layers, a shielding layer, a second interlayer dielectric layer, a lower sensing electrode layer, a third interlayer dielectric layer, an upper sensing electrode layer and a protective coating layer. An embedded memory and a sensing circuit are constructed in the silicon substrate. The first interlayer dielectric layer covers the silicon substrate. The plural conducting layers are formed over the first interlayer dielectric layer. The shielding layer is formed over the plural conducting layers. The second interlayer dielectric layer covers the shielding layer. The lower sensing electrode layer is formed over the second interlayer dielectric layer. The third interlayer dielectric layer is formed over the lower sensing electrode layer. The upper sensing electrode layer is formed over the third interlayer dielectric layer. The protective coating layer covers the upper sensing electrode layer. The upper sensing electrode layer and the lower sensing electrode layer are electrically connected with the sensing circuit through the conducting layers.

A second embodiment of the present invention provides a system. The system includes an integrated capacitance sensing module and a processing circuit. The integrated capacitance sensing module includes an embedded memory and a capacitor sensor constructed in a silicon substrate. The processing circuit is electrically connected to the integrated capacitance sensing module. The processing circuit controls the capacitor sensor to generate a user scan data, and the user scan data is stored in the memory.

Numerous objects, features and advantages of the present invention will be readily apparent upon a reading of the following detailed description of embodiments of the present invention when taken in conjunction with the accompanying drawings. However, the drawings employed herein are for the purpose of descriptions and should not be regarded as limiting.

BRIEF DESCRIPTION OF THE DRAWINGS

The above objects and advantages of the present invention will become more readily apparent to those ordinarily skilled in the art after reviewing the following detailed description and accompanying drawings, in which.

DETAILED DESCRIPTION OF PREFERRED EMBODIMENTS

Generally, a nonvolatile memory comprises floating gate transistor. For manufacturing the floating gate transistor, it is necessary to form a gate structure with two gates (i.e., a floating gate and a control gate). In other words, the process of fabricating the floating gate transistor is incompatible with the current logic circuit process.

The present invention provides a single poly floating gate transistor. The process of fabricating the single poly floating gate transistor is compatible with the current logic circuit process. Moreover, the present invention further provides a nonvolatile memory comprising the single poly floating gate transistor. Depending on the structures of the single poly floating gate transistors, the nonvolatile memories are classified into a one time programming nonvolatile memory (also referred as an OTP memory) and a multi-time programming nonvolatile memory (also referred as a MTP memory).

Figure 2A:
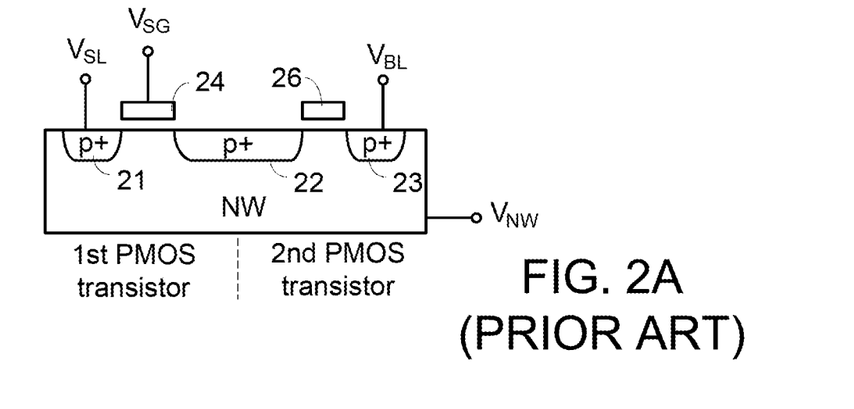
FIG. 2A is a schematic cross-sectional view illustrating a one time programming nonvolatile memory.
Figure 2B:
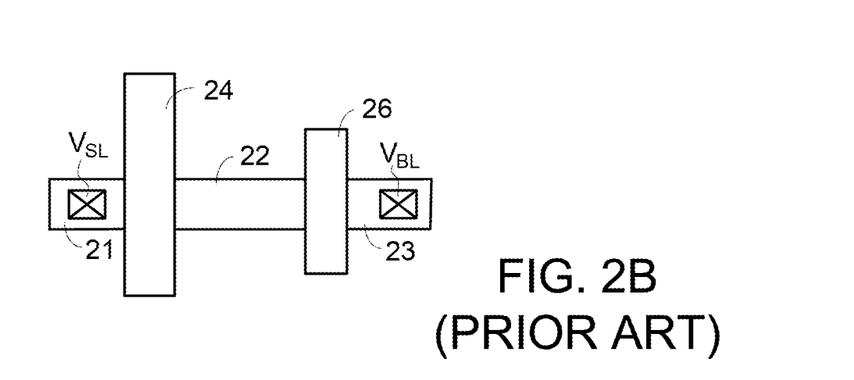
FIG. 2B is a schematic top view illustrating the one time programming nonvolatile memory of FIG. 2A.
Figure 2C:
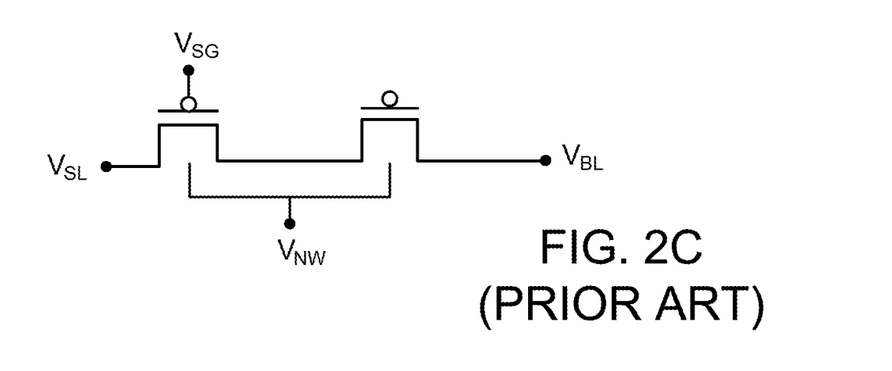
FIG. 2C is a schematic equivalent circuit diagram illustrating the one time programming nonvolatile memory of FIG. 2A.

FIG. 2A is a schematic cross-sectional view illustrating a one time programming nonvolatile memory. FIG. 2B is a schematic top view illustrating the one time programming nonvolatile memory of FIG. 2A. FIG. 2C is a schematic equivalent circuit diagram illustrating the one time programming nonvolatile memory of FIG. 2A.

Please refer to FIGS. 2A~2C. The one time programming nonvolatile memory comprises two serially-connected p-type metal-oxide semiconductor (PMOS) transistors. The first PMOS transistor is used as a select transistor. A select gate 24 of the first PMOS transistor is used as a word line and connected to a select gate voltage $V_{SG}$. A p-type doped source region 21 is connected to a source line voltage $V_{SL}$. Moreover, a p-type doped drain region 22 may be considered as a combination of a p-type doped drain region of the first PMOS transistor and a first p-type doped region of the second PMOS transistor.

The second PMOS transistor is a floating gate transistor. A floating gate 26 is disposed over the second PMOS transistor. A second p-type doped region 23 of the second PMOS transistor is connected to a bit line voltage $V_{BL}$. Moreover, the two PMOS transistors are constructed in an N-well region (NW). The N-well region is connected to an N-well voltage $V_{NW}$.

By properly controlling the select gate voltage $V_{SG}$, the source line voltage $V_{SL}$, the bit line voltage $V_{BL}$ and the N-well voltage $V_{NW}$, the one time programming nonvolatile memory may be operated in a program cycle or a read cycle. During the program cycle, hot carriers are selectively injected into the floating gate 26 to have different storage states. During the read cycle, the storage state of the second PMOS transistor is read. Since the two PMOS transistors of the one time programming nonvolatile memory have respective gates 24 and 26, the process of fabricating the one time programming nonvolatile memory is compatible with the current logic circuit process. It is noted that the configuration of the one time programming nonvolatile memory may be modified according to the practical requirements. For example, the one time programming nonvolatile memory comprises two serially-connected n-type metal-oxide semiconductor (NMOS) transistors.

Figures 3A, 3B, 3C, 3D:
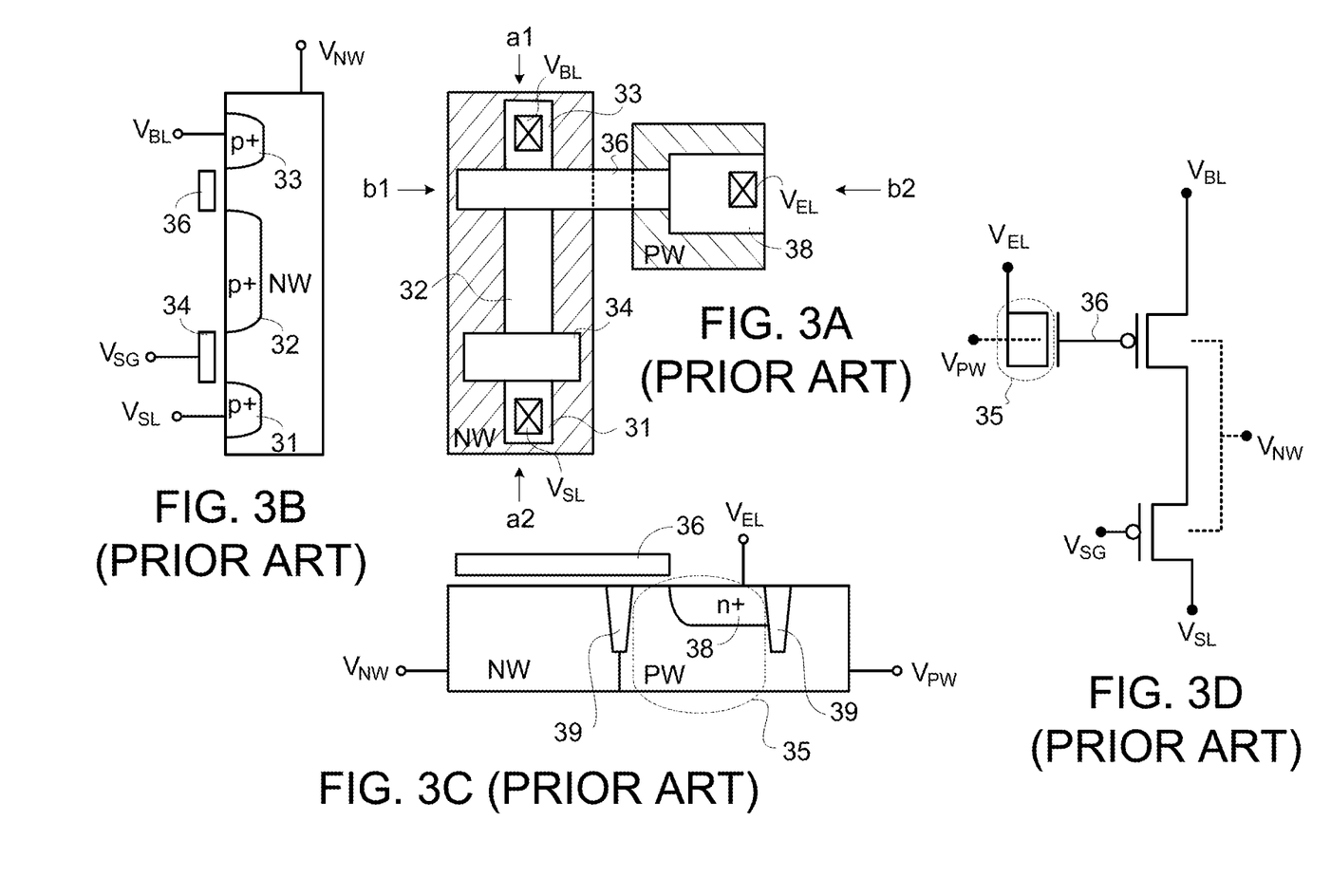
FIG. 3A is a schematic top view illustrating a multi-time programming nonvolatile memory.
FIG. 3B is a schematic cross-sectional view illustrating the multi-time programming nonvolatile memory of FIG. 3A and taken along a first direction (a1-a2)
FIG. 3C is a schematic cross-sectional view illustrating the multi-time programming nonvolatile memory of FIG. 3A and taken along a second direction (b1-b2)
FIG. 3D is a schematic equivalent circuit diagram of the multi-time programming nonvolatile memory.

FIG. 3A is a schematic top view illustrating a multi-time programming nonvolatile memory. FIG. 3B is a schematic cross-sectional view illustrating the multi-time programming nonvolatile memory of FIG. 3A and taken along a first direction (a1-a2). FIG. 3C is a schematic cross-sectional view illustrating the multi-time programming nonvolatile memory of FIG. 3A and taken along a second direction (b1-b2). FIG. 3D is a schematic equivalent circuit diagram of the multi-time programming nonvolatile memory.

As shown in FIGS. 3A and 3B, the multi-time programming nonvolatile memory comprises two serially-connected p-type metal-oxide semiconductor (PMOS) transistors. These two PMOS transistors are constructed in an N-well region (NW). Three p-type doped regions 31, 32 and 33 are formed in the N-well region (NW). In addition, two polysilicon gates 34 and 36 are spanned over the areas between the three p-type doped regions 31, 32 and 33.

The first PMOS transistor is a select transistor. A select gate 34 of the first PMOS transistor is used as a word line, and connected to a select gate voltage $V_{SG}$. The p-type doped region 31 is a p-type doped source region and connected to a source line voltage $V_{SL}$. The p-type doped region 32 is a p-type doped drain region, which may be considered as a combination of a p-type doped drain region of the first PMOS transistor and a first p-type doped region of the second PMOS transistor.

The second PMOS transistor is a floating gate transistor. A floating gate 36 is disposed over the second PMOS transistor. The p-type doped region 33 is a second p-type doped region of the second PMOS transistor and connected to a bit line voltage $V_{BL}$. Moreover, the N-well region (NW) is connected to an N-well voltage $V_{NW}$.

As shown in FIGS. 3A and 3C, the multi-time programming nonvolatile memory further comprises an n-type metal-oxide semiconductor (NMOS) transistor or a combination of the floating gate 36 and an erase gate region 35. An n-type doped region 38 is formed in a P-well region (PW). In other words, the erase gate region 35 comprises the P-well region (PW) and the n-type doped regions 38.

As shown in FIG. 3C, the floating gate 36 is extended to and arranged adjacent to the erase gate region 35. Consequently, the floating gate 36 may be considered as a gate of the NMOS transistor, and the n-type doped region 38 may be considered as a combination of an n-type doped source region and an n-type doped drain region of the NMOS transistor. The n-type doped region 38 is connected to an erase line voltage $V_{EL}$. In addition, the P-well region (PW) is connected to a P-well voltage $V_{PW}$. As shown in FIG. 3C, an isolation structure 39 is formed between the P-well region (PW) and the N-well region (NW). For example, the isolation structure 39 is a shallow trench isolation (STI) structure.

By properly controlling the erase line voltage $V_{EL}$, the select gate voltage $V_{SG}$, the source line voltage $V_{SL}$, the bit line voltage $V_{BL}$, the N-well voltage $V_{NW}$ and the P-well voltage $V_{PW}$, the multi-time programming nonvolatile memory may be operated in a program cycle, an erase cycle or a read cycle. During the program cycle, hot carriers are selectively injected into the floating gate 36 to have different storage states. During the erase cycle, the hot carriers are ejected from the floating gate 36. During the read cycle, the storage state of the second PMOS transistor is read. Since each of the three transistors of the multi-time programming nonvolatile memory has a corresponding gate 34 or 36, the process of fabricating the multi-time programming nonvolatile memory is compatible with the current logic circuit process.

Figure 4A:
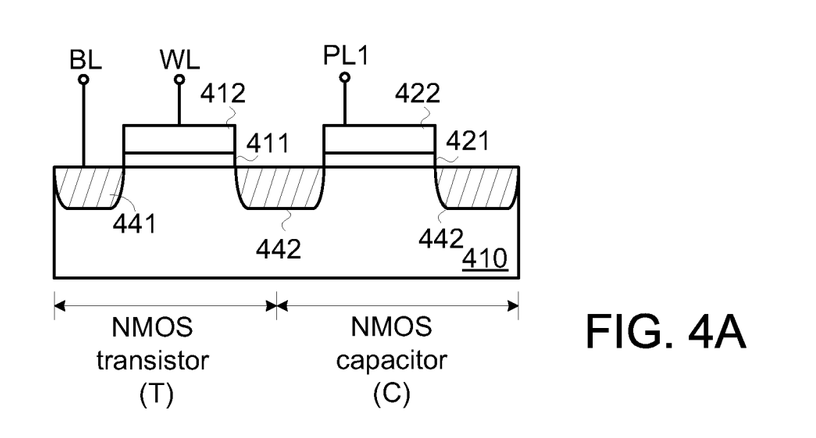
FIG. 4A is a schematic cross-sectional view illustrating another one time programming nonvolatile memory.
Figure 4B:
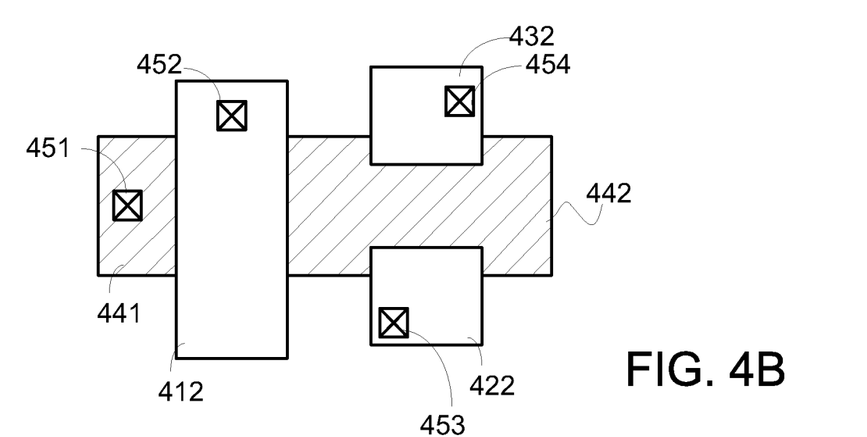
FIG. 4B is a schematic top view illustrating the one time programming nonvolatile memory of FIG. 4A.
Figure 4C:
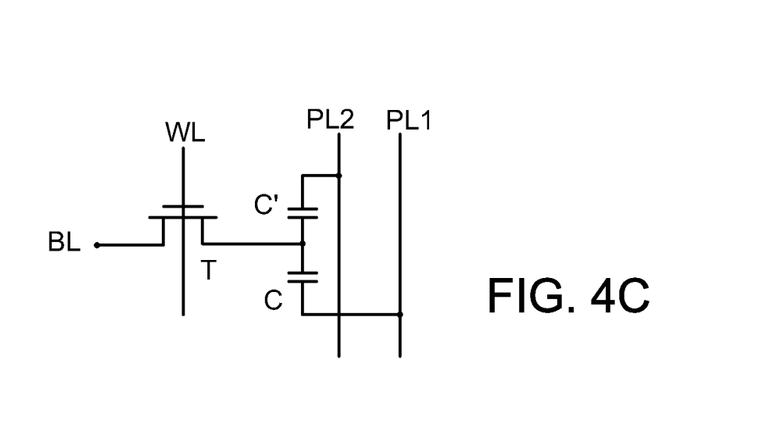
FIG. 4C is a schematic equivalent circuit diagram of the illustrating another one time programming nonvolatile memory of FIG. 4A.

FIG. 4A is a schematic cross-sectional view illustrating another one time programming nonvolatile memory. FIG. 4B is a schematic top view illustrating the one time programming nonvolatile memory of FIG. 4A. FIG. 4C is a schematic equivalent circuit diagram of the illustrating another one time programming nonvolatile memory of FIG. 4A.

Please refer to FIGS. 4A and 4B. The one time programming nonvolatile memory has a substrate with a P-well region 410. A first gate structure, a second gate structure and a third gate structure are formed over the P-well region 410. The first gate structure comprises a gate oxide layer 411 and a first polysilicon gate 412 overlying the gate oxide layer 411. The second gate structure comprises a gate oxide layer 421 and a second polysilicon gate 422 overlying the gate oxide layer 421. The third gate structure comprises a gate oxide layer (no shown) and a third polysilicon gate 432 overlying the gate oxide layer.

Please refer to FIG. 4B. After an ion implantation process is performed by using the three gate structures as the implantation masks, a first N+ diffusion region 441 and a second N+ diffusion region 442 are formed in the P-well region 410. The first N+ diffusion region 441 is located near a side of the first gate structure. The second N+ diffusion region 442 is located near another side of the first gate structure, a side of the second gate structure and a side of the third gate structure. Moreover, a first contact 451 is formed on the first N+ diffusion region 441, a second contact 452 is formed on the first polysilicon gate 412, a third contact 453 is formed on the second polysilicon gate 422, and a fourth contact 454 is formed on the third polysilicon gate 432. p Please refer to FIG. 4A. After a metal line forming process is performed, the first contact 451 is connected with a bit line BL, the second contact 452 is connected with a word line WL, the third contact 453 is connected with a first program line PL1, and the fourth contact 454 is connected with a second program line PL2.

Moreover, the first N+ diffusion region 441, the first gate structure and the second N+ diffusion region 442 are collaboratively defined as an n-type metal-oxide semiconductor (NMOS) transistor T, and the second gate structure and the second N+ diffusion region 442 are collaboratively defined as an n-type metal-oxide semiconductor (NMOS) capacitor C. Similarly, the third gate structure and the second N+ diffusion region 442 are collaboratively defined as another NMOS capacitor C' (not shown).

Please refer to FIG. 4C. The gate terminal of the NMOS transistor T is connected with the word line WL. The first N+ diffusion region 441 of the NMOS transistor T is connected with the bit line BL. The second N+ diffusion region 442 of the NMOS transistor T is connected with a first end of the NMOS capacitor C and a first end of the NMOS capacitor C'. A second end of the NMOS capacitor C is connected with the first program line PL1. A second end of the NMOS capacitor C' is connected with the second program line PL2.

Generally, the memory cell of the one time programming nonvolatile memory has a high-resistance storage state before programmed because the gate oxide layer of the NMOS capacitor C or C' is not ruptured. On the other hand, the memory cell of the one time programming nonvolatile memory has a low-resistance storage state after programmed because the gate oxide layer of the NMOS capacitor C or C' is not ruptured.

By properly controlling the voltages to word line WL, the bit line BL, the first program line PL1 and the second program line PL2, the one time programming nonvolatile memory may be operated in a program cycle or a read cycle.

Since the NMOS transistor T and the two NMOS capacitors C and C' of the one time programming nonvolatile memory have respective gates 412, 422 and 432, the process of fabricating the one time programming nonvolatile memory is compatible with the logic circuit process.

The present invention provides an integrated capacitance sensing module. The integrated capacitance sensing module is fabricated by a logic circuit process. A capacitor sensor and a memory of the integrated capacitance sensing module are formed on a semiconductor substrate.

FIGS. 5A~5E schematically illustrate the steps of fabricating an integrated capacitance sensing module according to an embodiment of the present invention.

Figure 5A:
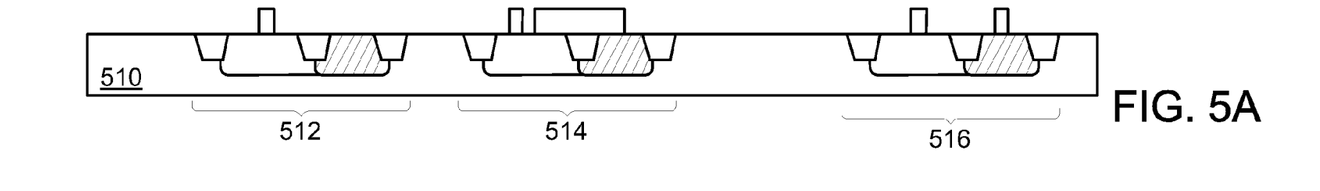
FIGS. 5A~5E schematically illustrate the steps of fabricating an integrated capacitance sensing module according to an embodiment of the present invention.

Firstly, as shown in FIG. 5A, a noise reduction circuit 512, an embedded memory 514 and a sensing circuit 516 are constructed in a silicon substrate 510 by a logic circuit process. The embedded memory 514 is a one time programming nonvolatile memory (also referred as an OTP memory) and a multi-time programming nonvolatile memory (also referred as a MTP memory).

Figure 5B:
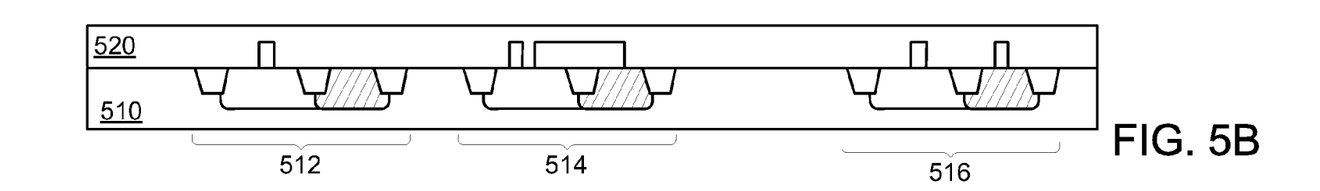

Then, as shown in FIG. 5B, a first interlayer dielectric (ILD) layer 520 is formed over the surface of the silicon substrate 510 to cover the noise reduction circuit 512, the embedded memory 514 and the sensing circuit 516.

Figure 5C:
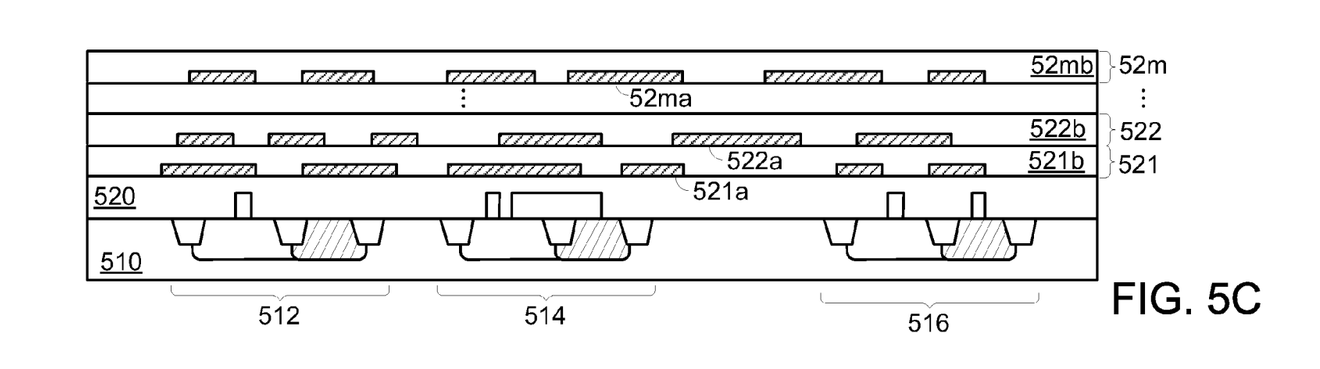

Then, as shown in FIG. 5C, plural conducting layers 521~52m are formed over the first interlayer dielectric layer 520. The conducting layers 521~52m comprise metal layers 521a∥52ma and inter-metal dielectric (IMD) layers 521b~52mb, respectively. The noise reduction circuit 512, the embedded memory 514 and the sensing circuit 516 are electrically connected with each other through the metal layers 521a~52ma.

Figure 5D:
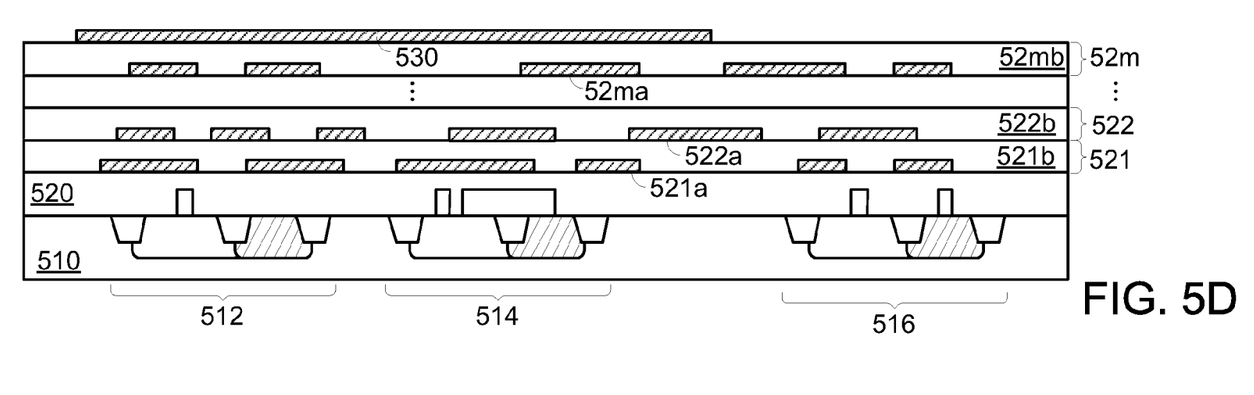

Then, as shown in FIG. 5D, a shielding layer 530 is formed over the conducting layers 521~52m and aligned with the embedded memory 514. In accordance with the present invention, the shielding layer 530 is located over the embedded memory 514. It is noted that the size of the shielding layer 530 may be expanded according to the practical requirements. For example, the shielding layer 530 is located over the noise reduction circuit 512 and the embedded memory 514. Moreover, the noise reduction circuit 512 provides a control voltage to the shielding layer 530 through the conducting layers 521~52m. The control voltage is a fixed voltage (e.g., a ground voltage). Generally, the shielding layer 530 is used for preventing electromagnetic interference (EMI), so that the embedded memory 514 can be operated normally.

Figure 5E:
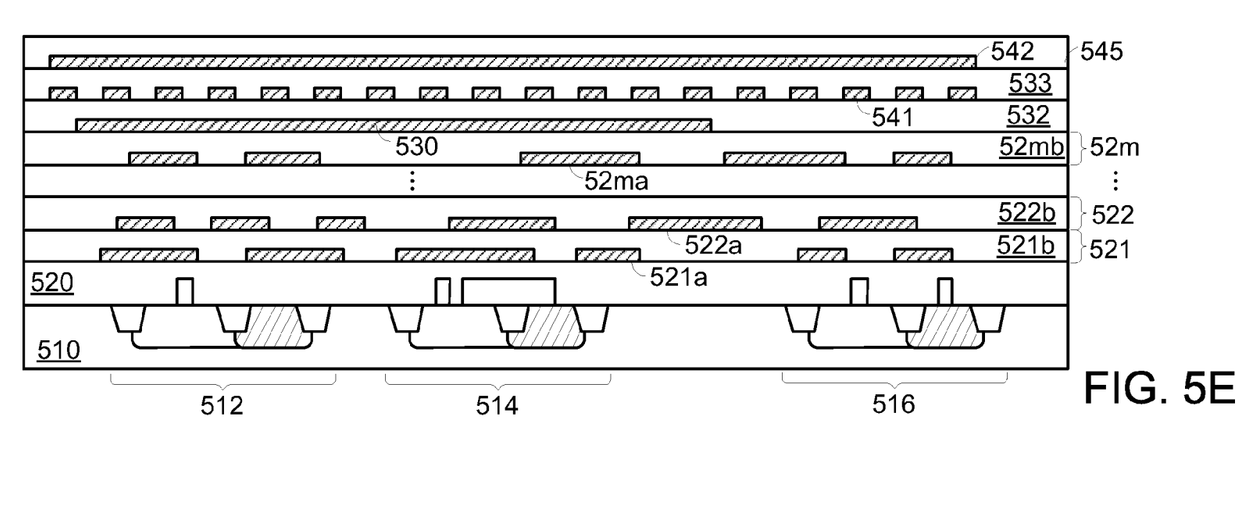

The, as shown in FIG. 5E, a second interlayer dielectric (ILD) layer 532 is formed over the shielding layer 530 to cover the shielding layer 530 and the conducting layers 521~52m. Sequentially, a lower sensing electrode layer 541 is formed over the second interlayer dielectric layer 532, a third interlayer dielectric (ILD) layer 533 is formed over the second interlayer dielectric layer 532 and the lower sensing electrode layer 541 to cover the second interlayer dielectric layer 532 and the lower sensing electrode layer 541, and an upper sensing electrode layer 542 is formed over the third interlayer dielectric layer 533. Afterwards, a protective coating layer 545 is formed over the third interlayer dielectric layer 533 and the upper sensing electrode layer 542 to cover the third interlayer dielectric layer 533 and the upper sensing electrode layer 542. The upper sensing electrode layer 542 and the lower sensing electrode layer 541 are electrically connected with the sensing circuit 516 through the conducting layers 521~52m.

In other words, the lower sensing electrode layer 541, the upper sensing electrode layer 542 and the sensing circuit 516 are collaboratively formed as a capacitor sensor. Moreover, the lower sensing electrode layer 541 comprises plural first electrodes, and the upper sensing electrode layer 542 comprises plural second electrodes. The first electrodes and the second electrodes are perpendicular to each other and collaboratively formed as a capacitor array.

Figure 6:
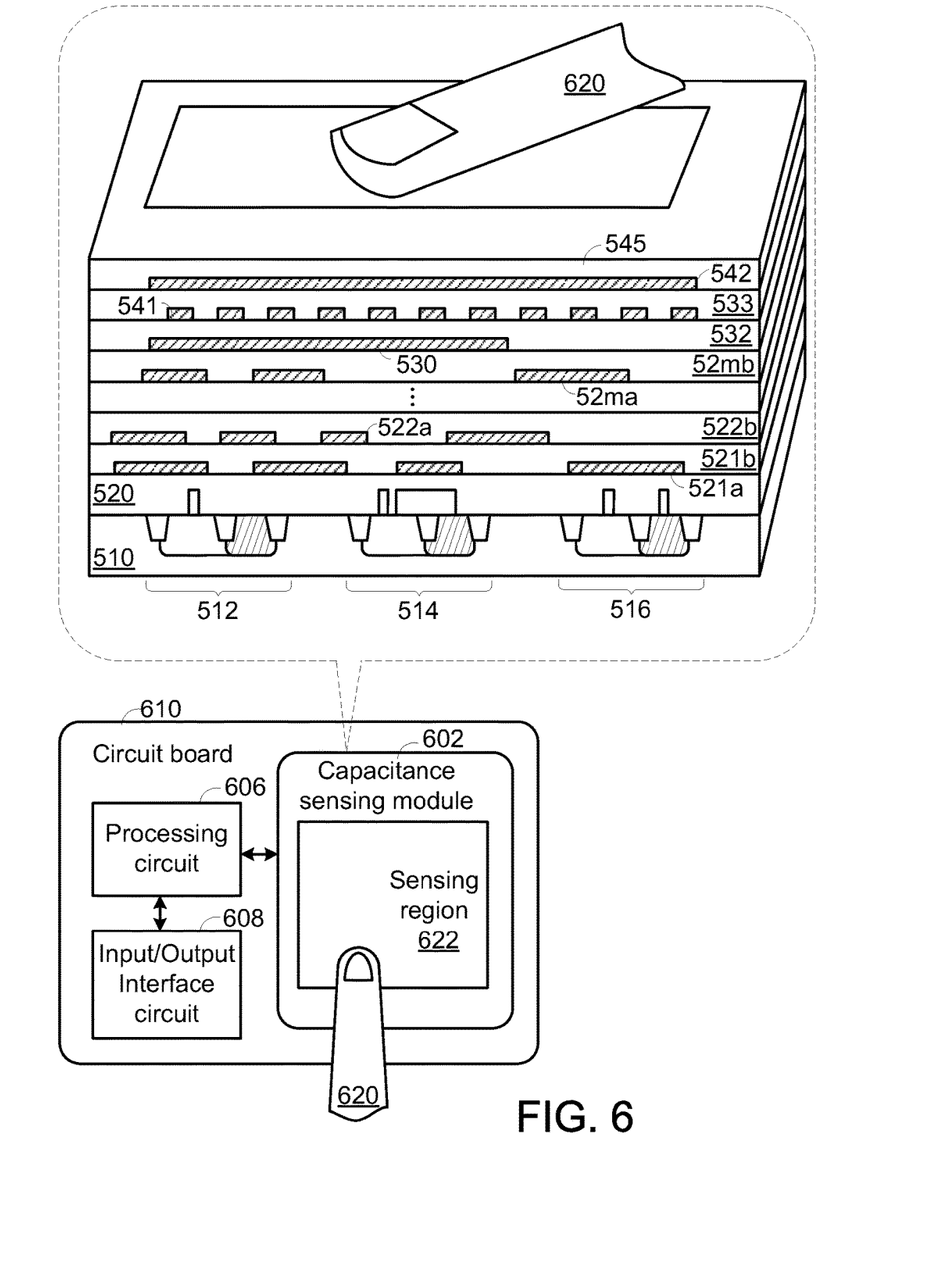
FIG. 6 schematically illustrates the operation of a system with the integrated capacitance sensing module of the present invention.

FIG. 6 schematically illustrates the operation of a system with the integrated capacitance sensing module of the present invention. In this embodiment, the system is a fingerprint recognition system. The fingerprint recognition system comprises a circuit board 610, a capacitance sensing module 602, a processing circuit 606 and an input/output interface circuit 608. The capacitance sensor 602, the processing circuit 606 and the input/output interface circuit 608 are mounted on the circuit board 610. The capacitance sensing module 602 integrates the capacitor sensor 512 and the embedded memory 514. Moreover, the processing circuit 606 is connected with the capacitance sensing module 602 and the input/output interface circuit 608.

Consequently, the capacitance sensing module 602 comprises plural capacitors, which are formed between the lower sensing electrode layer 541 and the upper sensing electrode layer 542. Alternatively, the input/output interface circuit 608 may be integrated into the processing circuit 606.

In a data creating mode, the user's finger 620 is placed on a sensing region 622 of the capacitance sensing module 602. According to a change of the electric field of the sensing region 622, the sensing circuit 516 of the capacitance sensing module 602 realizes the changes of the capacitance values of the plural capacitors of the capacitance sensing module 602. According to the changes of the capacitance values of the plural capacitors, the sensing circuit 516 acquires the biometric data of the user's finger 620 (also referred as a scan data). Then, the scan data is defined as a user scan data by the processing circuit 606, and the user scan data is stored into the embedded memory 514.

In a data identification mode, when the user's finger 620 is placed on the sensing region 622 of the capacitance sensing module 602, the sensing circuit 516 acquires a first scan data of the user's finger 620. Moreover, the processing circuit 606 compares the first scan data with the user scan data in the embedded memory 514. If the processing circuit 606 confirms that the first scan data complies with the user scan data, the processing circuit 606 controls the input/output interface circuit 608 to issue an acknowledge signal. Whereas, if the processing circuit 606 confirms that the first scan data does not comply with the user scan data, the processing circuit 606 controls the input/output interface circuit 608 to issue a not-acknowledge signal.

For example, the fingerprint recognition system is a door lock fingerprint recognition system. After the acknowledge signal is received by an electronic door lock, the electronic door lock is switched to an unlocked state and thus the door is opened. Whereas, if the not-acknowledge signal is received by the electronic door lock, the electronic door lock is maintained in the unlocked state and the door is not opened.

From the above descriptions, the present invention provides an integrated capacitance sensing module and an associated system. Since the memory is embedded into the integrated capacitance sensing module, the system with the integrated capacitance sensing module has a small size.

In some other embodiments, the integrated capacitance sensing module does not include the noise reduction circuit 512. Under this circumstance, the shielding layer 530 is directly connected to a fixed voltage (e.g., a ground voltage) through a metal wire. Consequently, the shielding layer 530 is capable of preventing electromagnetic interference (EMI).

Moreover, the embedded memory 514 of the integrated capacitance sensing module is divided into at least two storage zones. The first storage zone is a data storage zone for storing the scan data. The second storage zone is a working zone for storing the program code of the processing circuit 606. The working zone for storing the program code may be implemented with a one time programming nonvolatile memory, and the data storage zone for storing the scan data may be implemented with a multi-time programming nonvolatile memory. In other words, the embedded memory 514 is implemented with an OTP/MTP mixed-mode nonvolatile memory. Furthermore, the embedded memory may further adopt two cells per bit or multi-cells per bit design to protect the first storage zone (a data storage zone for storing the scan data).

Optionally, the embedded memory 514 further comprises an error correction circuit (ECC circuit) in order for minimizing the possibility of erroneously writing data or losing data. After an error correction process is performed on the user scan data by the error correction circuit, the user scan data is stored in the embedded memory 514.

More optionally, the embedded memory may further comprises defect block management circuit to reinforce the embedded memory reliability. The bigger the capacity of the embedded memory, the higher probability of defect blocks in the embedded memory. Thus with the aid of defect block management circuit, the defect blocks in the embedded memory are marked and blocked for follow-up operation.

Moreover, in case that the fabricating process is compatible with the logic circuit process, the processing circuit 606 controls the input/output interface circuit 608 are integrated into the same silicon substrate. Consequently, the size of the overall system is reduced.

While the invention has been described in terms of what is presently considered to be the most practical and preferred embodiments, it is to be understood that the invention needs not be limited to the disclosed embodiment. On the contrary, it is intended to cover various modifications and similar arrangements included within the spirit and scope of the appended claims which are to be accorded with the broadest interpretation so as to encompass all such modifications and similar structures.

What is claimed is:

1. An integrated capacitance sensing module, comprising:
a silicon substrate, wherein an embedded memory and a sensing circuit are constructed in the silicon substrate and fabricated at the same time;
a first interlayer dielectric layer covering the silicon substrate;
plural conducting layers formed over the first interlayer dielectric layer;
a shielding layer formed over the plural conducting layers;
a second interlayer dielectric layer covering the shielding layer;
a lower sensing electrode layer formed over the second interlayer dielectric layer;
a third interlayer dielectric layer formed over the lower sensing electrode layer;
an upper sensing electrode layer formed over the third interlayer dielectric layer; and
a protective coating layer covering the upper sensing electrode layer,
wherein the upper sensing electrode layer and the lower sensing electrode layer are electrically connected with the sensing circuit through the conducting layers;
wherein the embedded memory is a nonvolatile memory and the embedded memory comprises: a first PMOS transistor comprising a select gate, a first p-type doped region, and a second p-type doped region, wherein the first p-type doped region and a second p-type doped region are constructed in a N-well region of the silicon substrate, the N-well region is connected to a N-well voltage, the select gate is connected to a select gate voltage, and the first p-type doped region is connected to a source line voltage; a second PMOS transistor comprising the second p-type doped region, a third p-type doped region, and a floating gate, wherein the third p-type doped region is constructed in the N-well region of the silicon substrate, and the third p-type doped region is connected to a bit line voltage; and an erase gate region adjacent to the floating gate, wherein the erase gate region comprises a first n-type doped region connected to an erase line voltage and a first P-well region connected to a P-well voltage, and the first n-type doped region is constructed in the first P-well region of the silicon substrate; and
wherein the embedded memory further comprises: a first NMOS transistor comprising a first gate structure, a second n-type doped region, and a third n-type doped region, wherein the second n-type doped region and the third n-type doped region are constructed in a second P-well region of the silicon substrate; a first NMOS capacitor comprising a second gate structure and the third n-type doped region; and a second NMOS capacitor comprising a third gate structure and the third n-type doped region.

2. The integrated capacitance sensing module as claimed in claim 1, wherein the shielding layer is aligned with the embedded memory region for preventing electromagnetic interference, so that the embedded memory is operated normally.

3. The integrated capacitance sensing module as claimed in claim 1, wherein the shielding layer receives a control voltage.

4. The integrated capacitance sensing module as claimed in claim 1, further comprising a noise reduction circuit, wherein the noise reduction circuit provides the control voltage to the shielding layer through the plural conducting layers.

5. The integrated capacitance sensing module as claimed in claim 1, wherein the lower sensing electrode layer, the upper sensing electrode layer and the sensing circuit are collaboratively formed as a capacitor sensor, wherein the capacitor sensor is electrically connected with the embedded memory through the plural conducting layers.

6. The integrated capacitance sensing module as claimed in claim 1, wherein the lower sensing electrode layer comprises plural first electrodes, and the upper sensing electrode layer comprises plural second electrodes, wherein the first electrodes and the second electrodes are perpendicular to each other and collaboratively formed as a capacitor array.

7. A system, comprising:
an integrated capacitance sensing module comprising an embedded memory and a capacitor sensor constructed in a silicon substrate; and
a processing circuit electrically connected to the integrated capacitance sensing module, wherein the processing circuit controls the capacitor sensor to generate a user scan data, and the user scan data is stored in the embedded memory;
wherein the embedded memory is a nonvolatile memory and the embedded memory comprises: a first PMOS transistor comprising a select gate, a first p-type doped region, and a second p-type doped region, wherein the first p-type doped region and a second p-type doped region are constructed in a N-well region of the silicon substrate, the N-well region is connected to a N-well voltage, the select gate is connected to a select gate voltage, and the first p-type doped region is connected to a source line voltage; a second PMOS transistor comprising the second p-type doped region, a third p-type doped region, and a floating gate, wherein the third p-type doped region is constructed in the N-well region of the silicon substrate, and the third p-type doped region is connected to a bit line voltage; and an erase gate region adjacent to the floating gate, wherein the erase gate region comprises a first n-type doped region connected to an erase line voltage and a first P-well region connected to a P-well voltage, and the first n-type doped region is constructed in the first P-well region of the silicon substrate; and
wherein the embedded memory further comprises: a first NMOS transistor comprising a first gate structure, a second n-type doped region, and a third n-type doped region, wherein the second n-type doped region and the third n-type doped region are constructed in a second P-well region of the silicon substrate; a first NMOS capacitor comprising a second gate structure and the third n-type doped region; and a second NMOS capacitor comprising a third gate structure and the third n-type doped region.

8. The system as claimed in claim 7, further comprising an input/output interface circuit, wherein the input/output interface circuit is connected to the processing circuit, and the processing circuit, the input/output interface circuit and the integrated capacitance sensing module are fixed on a circuit board.

9. The system as claimed in claim 7, wherein the embedded memory further comprises an error correction circuit, wherein after an error correction process is performed on the user scan data by the error correction circuit, the user scan data is stored in the embedded memory.

10. The system as claimed in claim 7, wherein the embedded memory comprises a first storage zone for storing the user scan data and a second storage zone for storing a program code of the processing circuit.

11. The system as claimed in claim 7, wherein the integrated capacitance sensing module comprises:
- a first interlayer dielectric layer covering the silicon substrate;
- plural conducting layers formed over the first interlayer dielectric layer;
- a shielding layer formed over the plural conducting layers;
- a second interlayer dielectric layer covering the shielding layer;
- a lower sensing electrode layer formed over the second interlayer dielectric layer;
- a third interlayer dielectric layer formed over the lower sensing electrode layer;
- an upper sensing electrode layer formed over the third interlayer dielectric layer; and
- a protective coating layer covering the upper sensing electrode layer,
- wherein the upper sensing electrode layer and the lower sensing electrode layer are electrically connected with the sensing circuit through the conducting layers.

12. The system as claimed in claim 11, wherein the shielding layer is aligned with the embedded memory region for preventing electromagnetic interference, so that the embedded memory is operated normally.

13. The system as claimed in claim 11, wherein the shielding layer receives a control voltage.

14. The system as claimed in claim 13, further comprising a noise reduction circuit, wherein the noise reduction circuit provides the control voltage to the shielding layer through the plural conducting layers.

15. The system as claimed in claim 11, wherein the lower sensing electrode layer, the upper sensing electrode layer and the sensing circuit are collaboratively formed as the capacitor sensor, wherein the capacitor sensor is electrically connected with the embedded memory through the plural conducting layers.

16. The system as claimed in claim 11, wherein the lower sensing electrode layer comprises plural first electrodes, and the upper sensing electrode layer comprises plural second electrodes, wherein the first electrodes and the second electrodes are perpendicular to each other and collaboratively formed as a capacitor array.

17. The system as claimed in claim 7, wherein the embedded memory may adopt two cells per bit or multi-cells per bit design to protect the user scan data.

18. The system as claimed in claim 7, wherein the embedded memory further comprises a defect block management circuit to reinforce the embedded memory reliability.

* * * * *